(12) United States Patent
Liu et al.

(10) Patent No.: US 7,129,730 B2
(45) Date of Patent: Oct. 31, 2006

(54) PROBE CARD ASSEMBLY

(75) Inventors: An-Hong Liu, Tainan (TW); Yeong-Her Wang, Tainan (TW); Yeong-Ching Chao, Taichung (TW); Yao-Jung Lee, Tainan (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/011,104

(22) Filed: Dec. 15, 2004

(65) Prior Publication Data
US 2006/0125501 A1   Jun. 15, 2006

(51) Int. Cl.
*G01R 31/02* (2006.01)

(52) U.S. Cl. .................................... 324/758

(58) Field of Classification Search ............... None
See application file for complete search history.

(56) References Cited

U.S. PATENT DOCUMENTS 5,389,885 A * 2/1995 Swart ........................ 324/761
6,359,452 B1 * 3/2002 Mozzetta ..................... 324/754
6,729,019 B1 * 5/2004 Grube et al. .................. 29/830
6,799,976 B1 * 10/2004 Mok et al. ..................... 439/55
2002/0043980 A1 * 4/2002 Rincon et al. ............... 324/754
2003/0038647 A1 * 2/2003 Eldridge et al. ............ 324/754
2003/0099097 A1 * 5/2003 Mok et al. ................... 361/767
2004/0223309 A1 * 11/2004 Haemer et al. ............. 361/767

FOREIGN PATENT DOCUMENTS

TW            547643 Y       8/2003

* cited by examiner

*Primary Examiner*—Ernest Karlsen
*Assistant Examiner*—Richard Isla-Rodas
(74) *Attorney, Agent, or Firm*—Troxell Law Office, PLLC

(57) ABSTRACT

A modularized probe head assembly mainly includes a probe head, an interposer and a probe head carrier with guide pins. The probe head has a plurality of first through holes. The interposer has a plurality of second through holes corresponding in location to the first through holes. The probe head carrier is configured to secure the PCB of a probe card and jointing the probe head with the interposer. A via is formed under a pad on the interposer. A plurality of stud bumps are formed on the pad. After assembling of the probe card, the guide pins pass through the first and second through holes and the stud bumps electrically contact the interconnect pad of the probe head.

6 Claims, 2 Drawing Sheets

PROBE CARD ASSEMBLY

FIELD OF THE INVENTION

The present invention relates to a probe head assembly configured for assembling on a probe card for probing semiconductor wafers, more particularly to a modularized probe head assembly.

BACKGROUND OF THE INVENTION

During a semiconductor fabrication process, integrated circuits are formed on a wafer. The wafer is a semiconductor substrate made of silicon or gallium arsenide. The wafer contains a plurality of chips. These chips are designed with different circuits for various functions, such as microprocessor, memory circuits and logic circuits. After the fabrication process and before it is singulated, the wafer will need to pass functional test to verify their electrical performance within design specification. Conventionally, a test head of a tester for chip probing usually mounts a probe card with a plurality of probe needles or other contact members for contacting with electrodes, such as bonding pads or bumps, of a wafer. The probe card provides temporarily electrical transmission between the tester and the wafer under test. As new semiconductor products varies from generations to generations, the conventional probe card will also need to be modified and redesigned.

A conventional modular probe head assembly is disclosed in the ROC Taiwan Patent publication No. 547,643. As shown in FIG. 1, the probe card includes a printed circuit board 10, a probe head 20, a flexible printed circuit board 30, and a pressure plate 40. The probe head 20 includes a silicon substrate 21 which is installed in a holder 22. The silicon substrate 21 has an upper surface and a lower surface, wherein the upper surface is arranged with a plurality of probe pads 23, conductive circuits and contact pads 24 at the periphery. The conductive circuits provide electrical connection between probe pads 23 and contact pads 24. The pressure plate 40 is formed with at least an opening corresponding in location to silicon substrate 21. The pressure plate 40 presses the flexible printed circuit board 30 to acquire electrical contact between the contact terminal 31 and the contact pads 24 of the silicon substrate 21. Nevertheless, if the probe head 20 and flexible printed circuit board are mal-alignment, it is unable to provide electrical connection between the contact terminal 31 of flexible printed circuit board 30 and the contact pads 24 of the probe head 20 by compression of the pressure plate 40. Furthermore, the pressure plate 40 and the flexible printed circuit board 30 provides a certain height above the probe head 20 so that a long probe needles 25 are required to fabricated on the probe pads 23 to contact with the wafer under test for chip probing.

SUMMARY OF THE INVENTION

A main purpose of the present invention is to provide a probe head assembly with accurate alignment. An interposer is positioned between a probe head and the PCB of a probe card by means of a probe head carrier with guide pins. The interposer includes a via under a pad. A plurality of bumps are bonded onto the pad. The bumps electrically contact an interconnect pad of the probe head by the connection of the probe head carrier and the alignment of the guide pins. It reduces the possibility of damaging the probe head. Besides, an interposer also is provided.

The probe head assembly according to the present invention mainly includes a probe head, an interposer and a probe head carrier with a plurality of guide pins. The probe head has a contact surface, a back surface and a plurality of first through holes. Probes are formed on the contact surface of the probe head, and at least an interconnect pad is formed on the back surface. The interposer is installed between the probe head and the PCB of a probe card by the probe head carrier. The interposer has a first surface, a second surface and a plurality of second through holes, and includes a via under a pad. A plurality bumps are formed on the pad, preferably, the bumps on a single pad are arranged in an array. When the probe head carrier is assembled to a PCB, the guide pins pass through the first and second through holes, and the bumps electrically contact an interconnect pad of the probe head.

DETAIL DESCRIPTION OF THE INVENTION

Please refer to the drawings attached, present invention will be described by means of an embodiment below.

Figure 1:
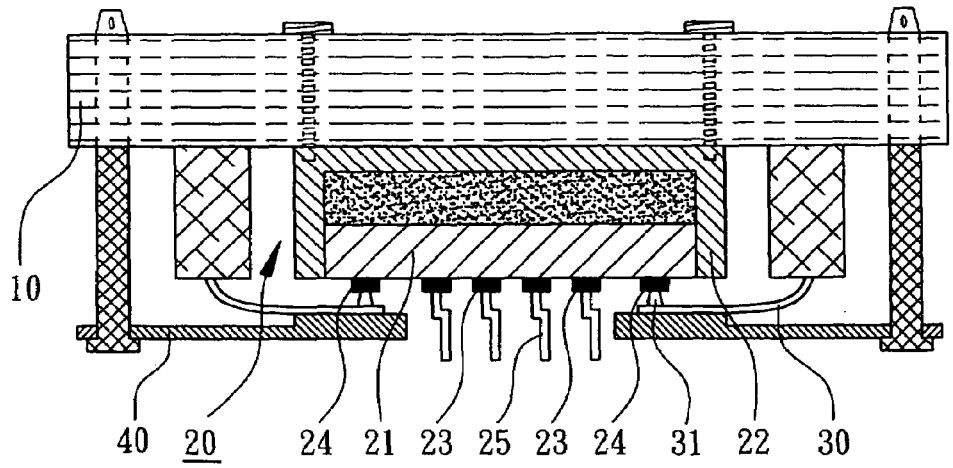
FIG. 1 is a cross-sectional view of a probe card revealed in the R.O.C. Taiwan Patent publication No. 547,643.
Figure 2:
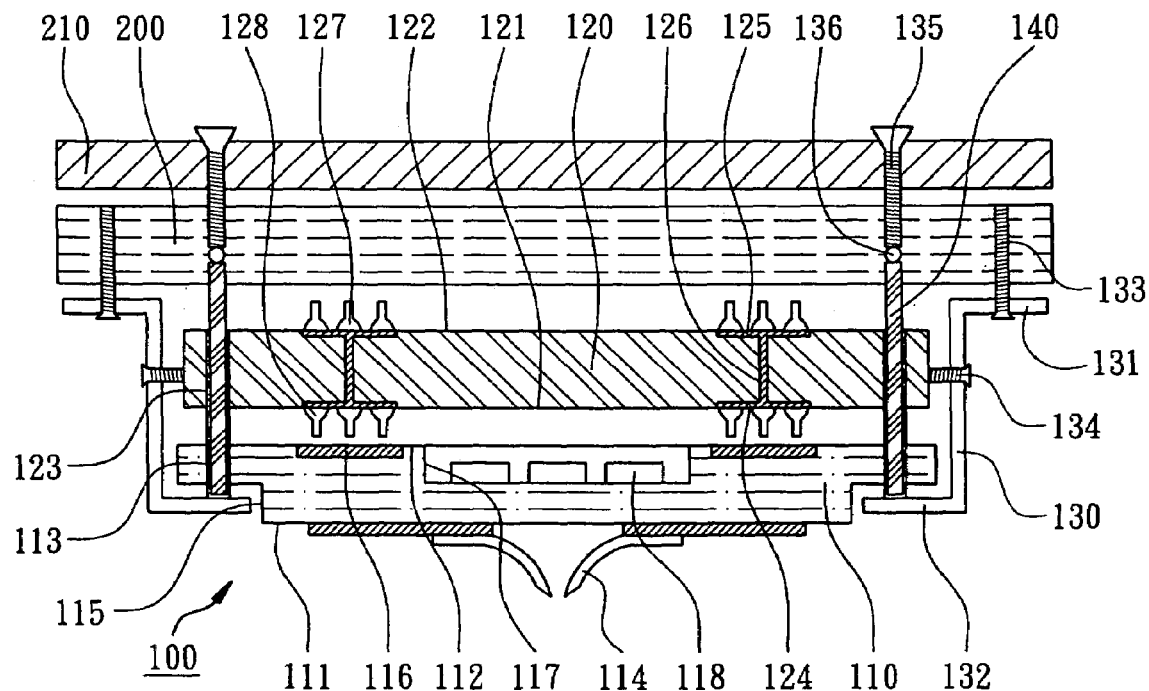
FIG. 2 is a cross-sectional view of a probe head assembly in accordance with the present invention.

As shown in FIG. 2, a probe head assembly 100 is assembled on the PCB 200 of a probe card. The probe head assembly 100 mainly includes a probe head 110, an interposer 120 and a probe head carrier 130 with a plurality of guide pins 140. The probe head 110 has fine traces, which may be selected from a silicon substrate, ceramic substrate, glass substrate, or a glass-fiber FR-4 substrate. The probe head 110 has a contact surface 111, a back surface 112, and a plurality of first through holes 113. Formed on the contact surface of probe head 110 are a plurality of probes 114, such as probing bumps or probing needles with all kind of shapes. The probes 114 are configured for probing a wafer under test (not shown in Figure). The probe head 110 may have a downset 115 at the periphery of contact surface 111 for clamping. Formed on the back surface 112 of the probe head 110 are a plurality of interconnect pads 116 which are electrically connected with the corresponding probes 114 by the inner circuits of the probe head 110. In this embodiment, the probe head 110 has a cavity 117 in the back surface 112. At least a decoupling component 118 may be accommodated in the cavity 117.

Figure 3:
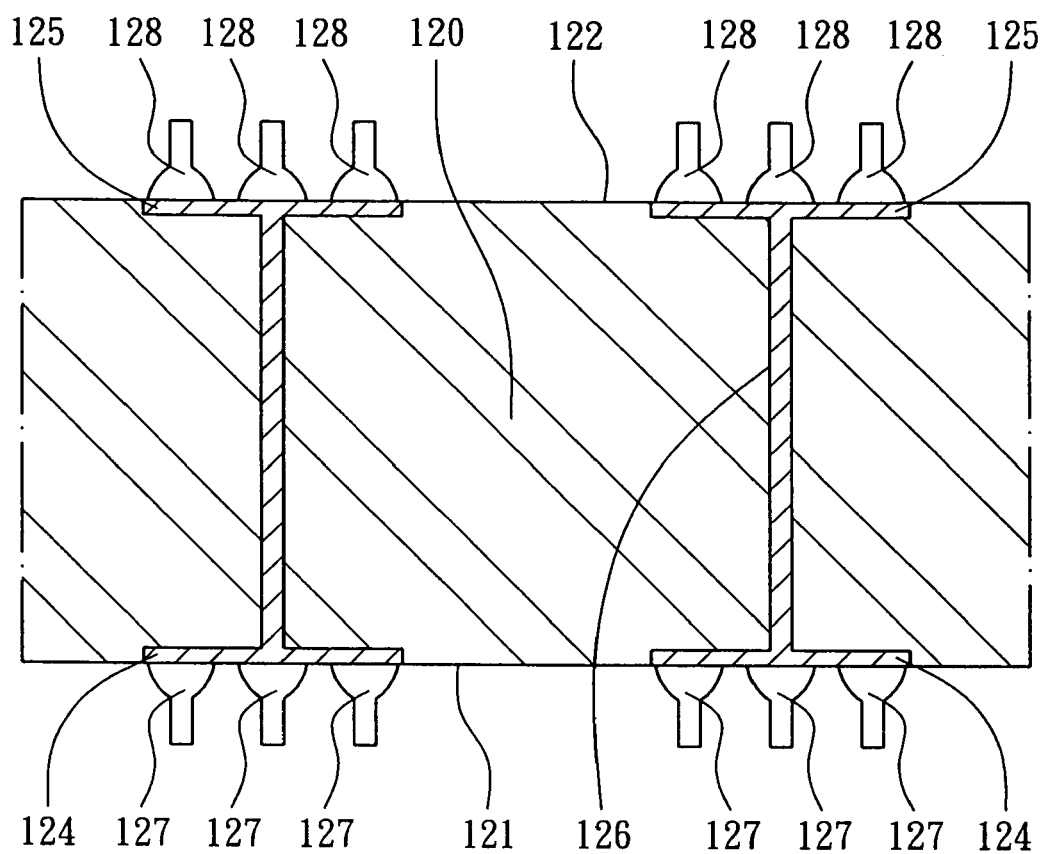
FIG. 3 is a cross-sectional view of an interposer of the probe head assembly in accordance with the present invention.
Figure 4:
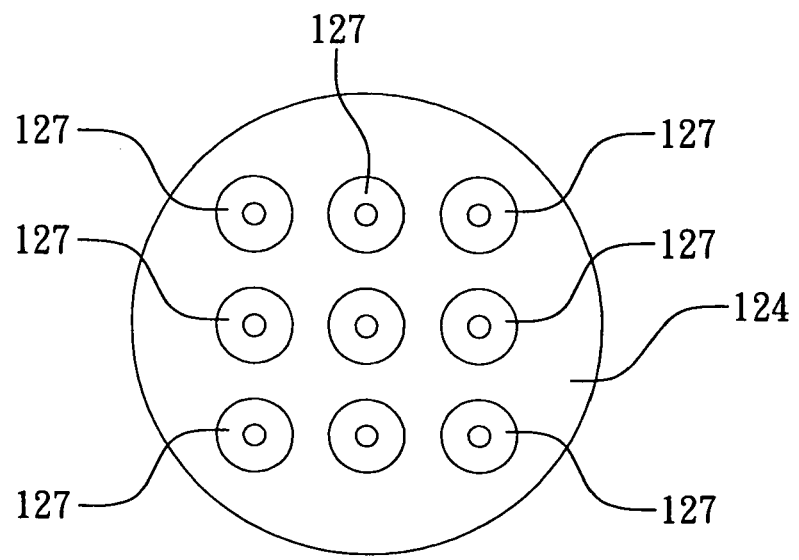
FIG. 4 is a top view of one pad of the interposer with bumps in accordance with the present invention.

The interposer 120 is installed between the probe head 110 and the PCB 200. The interposer 120 has a first surface 121, a second surface 122 and a plurality of second through holes 123. Referring to FIGS. 2 and 3, a plurality of first pads 124 are formed on the first surface 121, and a plurality of second pads 125 are formed on the second surface 122. Moreover, the interposer 120 includes a plurality vias 126 which vertically and electrically connect the first pads 124 and the second pads 125. In this embodiment, the diameter of the vias is about 400 im, the diameter of each first pad 124 or second pad 125 is more than 450 im. There are mutiple bumps 127, 128 formed on each first pad 124 and each second pad 125 respectively for electrically contacting the probe head 110 and the PCB 200 respectively. Preferably, the bumps 127, 128 are stud bumps which can be fabricated by wire-bonding technique. Referring to FIG. 4, the bumps 127 on one of the first pads 124 are arranged in an array.

Referring to FIG. 2 again, the probe head carrier 130 hold the probe head 110 and the interposer 120 together. The probe head carrier 130 has an extended portion 131 and a clamping portion 132. The clamping portion 132 is attached to the downset 115 of the probe head 110. The extended portion 131 is fixed to the PCB 200 by fixing screws 133. In this embodiment, the fixing screws 133 pass through the extended portion 131 and the PCB 200 and connect to the stiffener 210. Furthermore, the guide pins 140 pass through the first through holes 113 of the probe head 110 and the second through holes 123 of the interposer 120. The probe head carrier 130 further includes a plurality of Y Yalignment screws 134 for adjusting Y position of the interposer 120 and a plurality of X alignment screws (not shown) for adjusting the X position of the interposer 120. A plurality of Z alignment screws 135 may be connected to the POB 200, and a plurality of alignment ball 136 are positioned between tips of the Z alignment screws 135 and the guide pins 140. Preferably, if Z alignment screws 135 are employed, the interposer 120 is first adiusted for X–Y alignment by turning the X alignment screws (not shown) and the Y alignment screws 134 and, then inserting the guide pins 140 and Z alignment screws 135 once the interposer is properly aligned. Adiusiments may then be made to the Z position of the interposer.

Therefore, the probe head assembly 100 is modularized. When the probe head carrier 130 is assembled to the PCB 200, the interposer 120 is positioned under excellent alignment. The multiple bumps 127 can electrically contact each of the interconnect pads 116, and the multiple bumps 128 can electrically contact the PCB 200. The multiple bumps 127 on each first pad 124 ensure the electrical contact with the interconnect pad 116. The probe head 110 can be repeatedly assembled without damage of the PCB 200 and the probe head 110. Besides, the interposer 120 can be designed as a standard to be fabricated at low cost.

The above description of embodiments of this invention is intended to be illustrative and not limiting. Other embodiments of this invention will be obvious to those skilled in the art in view of the above disclosure.

What is claimed is:

1. A probe card assembly comprising:
   a PCB;
   a probe head having a contact surface, a back surface and a plurality of first through holes;
   a plurality of probes formed on the contact surface;
   an interconnect pad formed on the back surface and electrically connected to the probe;
   an interposer disposed between the probe head and the PCB, the interposer having a first surface, a second surface and a plurality of second through holes, the interposer includes at least a first pad on the first surface and at least a via under the corresponding first pad;
   a plurality of bumps bonded onto the first pad; and
   a probe head carrier for jointing the probe head with the interposer;
   a plurality of Z alignment screws connected to the PCB;
   a plurality of guide pins disposed between the probe head carrier and the Z alignment screws;
   the probes being configured for the testing of a wafer, wherein when the probe head carrier is assembled to the PCB by the probe head carrier, the interposer is disposed between the PCB and the probe head, the guide pins pass through the first and second through holes, and the bumps electrically contact the interconnect pad, wherein the probe head carrier includes a plurality of Y alignment screw for adjusting a Y position of the interposer and a plurality of X alignment screws for adjusting an X position of the interposer.

2. The probe head assembly according to claim 1, wherein the bumps are stud bumps.

3. The probe head assembly according to claim 1, wherein the bumps on the first pad are arranged in an array.

4. The probe head assembly according to claim 1, wherein the probe head carrier has an extended portion for connecting to the PCB of a probe card by screwing.

5. The probe head assembly according to claim 1, wherein the probe head has indention in the back surface for accommodating decoupling components.

6. The probe head assembly according to claim 1, wherein the interposer further includes at least a second pad on the second surface, a vertical vias electrically connecting the second pad and the first pad.

* * * * *